US012525445B2

(12) United States Patent
Pang et al.

(10) Patent No.: US 12,525,445 B2
(45) **Date of Patent: *Jan. 13, 2026**

(54) PROCESS SOLUTION FOR POLYMER PROCESSING

(71) Applicant: DONGWOO FINE-CHEM CO., LTD., Jeollabuk-do (KR)

(72) Inventors: Soon-Hong Pang, Jeollabuk-do (KR); Han-Byeol Kang, Gyeonggi-do (KR); Sung-Sik Kim, Jeollabuk-do (KR); Tae-Hee Kim, Jeollabuk-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 794 days.

This patent is subject to a terminal disclaimer.

(21) Appl. No.: 17/546,712

(22) Filed: Dec. 9, 2021

(65) Prior Publication Data

US 2022/0189760 A1 Jun. 16, 2022

(30) Foreign Application Priority Data

Dec. 11, 2020 (KR) ........................ 10-2020-0173172

(51) Int. Cl.

| | |
|---|---|
| ***C11D 3/24*** | (2006.01) |
| ***C11D 3/28*** | (2006.01) |
| ***C11D 3/30*** | (2006.01) |
| ***C11D 3/34*** | (2006.01) |
| ***C11D 3/36*** | (2006.01) |
| ***C11D 3/43*** | (2006.01) |
| ***C11D 7/28*** | (2006.01) |
| ***C11D 7/32*** | (2006.01) |
| ***C11D 7/34*** | (2006.01) |
| ***C11D 7/50*** | (2006.01) |
| ***H01L 21/02*** | (2006.01) |

(52) U.S. Cl.

CPC .......... *H01L 21/0209* (2013.01); *C11D 3/245* (2013.01); *C11D 3/28* (2013.01); *C11D 3/30* (2013.01); *C11D 3/34* (2013.01); *C11D 3/3409* (2013.01); *C11D 3/3427* (2013.01); *C11D 3/3436* (2013.01); *C11D 3/3445* (2013.01); *C11D 3/349* (2013.01); *C11D 3/368* (2013.01); *C11D 3/43* (2013.01); *C11D 7/28* (2013.01); *C11D 7/3209* (2013.01); *C11D 7/34* (2013.01); *C11D 7/50* (2013.01); *C11D 7/5004* (2013.01)

(58) Field of Classification Search

CPC .. C11D 3/28; C11D 3/30; C11D 3/445; C11D 3/245; C11D 7/28; C11D 7/34; C11D 7/3209; C11D 7/50; C11D 7/5004

USPC ....... 510/175, 176, 245, 255, 259, 260, 265, 510/274, 493, 500, 501, 504

See application file for complete search history.

(56) References Cited

U.S. PATENT DOCUMENTS

| | | | | |
|---|---|---|---|---|
| 6,652,665 | B1 | 11/2003 | Sachdev et al. | |
| 6,773,873 | B2 | 8/2004 | Seijo et al. | |
| 6,818,608 | B2 | 11/2004 | Moore | |
| 7,192,910 | B2 | 3/2007 | Wojtczak et al. | |
| 8,802,608 | B2 | 8/2014 | Shimada et al. | |
| 10,460,954 | B2 | 10/2019 | Cooper et al. | |
| 11,175,585 | B2 | 11/2021 | Murayama et al. | |
| 11,739,048 | B2 * | 8/2023 | Pang | C07C 211/63 156/247 |
| 2005/0003977 | A1 | 1/2005 | Itano et al. | |
| 2005/0014667 | A1 | 1/2005 | Aoyama et al. | |
| 2005/0187118 | A1 | 8/2005 | Haraguchi et al. | |
| 2006/0003910 | A1 | 1/2006 | Hsu et al. | |
| 2006/0234516 | A1 | 10/2006 | Hong et al. | |
| 2006/0237392 | A1 | 10/2006 | Auger et al. | |
| 2007/0179072 | A1 | 8/2007 | Rao et al. | |
| 2008/0004197 | A1 * | 1/2008 | Kneer | C11D 3/245 134/2 |
| 2009/0032766 | A1 | 2/2009 | Rajaratnam et al. | |
| 2009/0093107 | A1 | 4/2009 | Lee et al. | |
| 2010/0163788 | A1 | 7/2010 | Visintin et al. | |
| 2010/0197136 | A1 | 8/2010 | Shimada et al. | |
| 2012/0181668 | A1 | 7/2012 | Doll et al. | |
| 2017/0200619 | A1 | 7/2017 | Cooper et al. | |
| 2018/0230401 | A1 | 8/2018 | Sakanishi et al. | |
| 2018/0265819 | A1 | 9/2018 | Kang et al. | |
| 2019/0064672 | A1 | 2/2019 | Murayama et al. | |
| 2020/0013618 | A1 | 1/2020 | Weng et al. | |
| 2022/0186152 | A1 | 6/2022 | Tanabe et al. | |
| 2022/0195352 | A1 | 6/2022 | Sugo et al. | |

FOREIGN PATENT DOCUMENTS

| | | | |
|---|---|---|---|
| CA | 2544209 | A1 | 5/2005 |
| CN | 1575331 | A | 2/2005 |
| CN | 1643454 | A | 7/2005 |
| CN | 101013273 | A | 8/2007 |
| CN | 103804980 | A | 5/2014 |

(Continued)

OTHER PUBLICATIONS

Shao, "Haiyang Fushi Yu Shengwu Wusun Fanghu Yanjiu", Jilin University Press, Mar. 2019.

*Primary Examiner* — Gregory R Delcotto
(74) *Attorney, Agent, or Firm* — Venable LLP

(57) ABSTRACT

The present disclosure relates to a process solution for polymer processing, containing a polar aprotic solvent, a fluorine-based compound, and a sulfur-containing compound. The process solution for polymer processing may have excellent storage stability and minimize damage to the metal layer while improving an ability to remove the adhesive polymer remaining on a circuit surface of a semiconductor wafer.

8 Claims, No Drawings

(56) References Cited

FOREIGN PATENT DOCUMENTS

| | | | |
|---|---|---|---|
| CN | 108435101 | A | 8/2018 |
| CN | 109075035 | A | 12/2018 |
| EP | 1975987 | A2 | 10/2008 |
| JP | 2006009006 | A | 1/2006 |
| JP | 2006295118 | A | 10/2006 |
| JP | 2007027382 | A | 2/2007 |
| JP | 2009-194087 | A | 8/2009 |
| JP | 2009212383 | A | 9/2009 |
| JP | 2010515246 | A | 5/2010 |
| JP | 2017519862 | A | 7/2017 |
| JP | 2020189927 | A | 11/2020 |
| KR | 2003-0093974 | A | 12/2003 |
| KR | 10-2009-0096728 | A | 9/2009 |
| KR | 10-2010-0044777 | A | 4/2010 |
| KR | 10-2014-005994 | A | 5/2014 |
| KR | 10-2014-0060389 | A | 5/2014 |
| KR | 20150016430 | A | 2/2015 |
| KR | 10-2016-0039945 | A | 4/2016 |
| KR | 10-2016-0073288 | A | 6/2016 |
| KR | 20160070385 | A | 6/2016 |
| KR | 20160070386 | A | 6/2016 |
| KR | 10-20160087089 | A | 7/2016 |
| KR | 10-20160101511 | A | 8/2016 |
| KR | 10-2017-0015452 | A | 2/2017 |
| KR | 10-2192954 | B1 | 12/2020 |
| TW | 200641562 | A | 12/2006 |
| TW | 202106865 | A | 2/2021 |
| WO | 2007120259 | A2 | 10/2007 |
| WO | 2008080097 | A2 | 7/2008 |
| WO | 2008157345 | A2 | 12/2008 |
| WO | 2010039936 | A2 | 4/2010 |
| WO | 2009/013987 | A1 | 9/2010 |
| WO | 2020235605 | A1 | 11/2020 |

* cited by examiner

PROCESS SOLUTION FOR POLYMER PROCESSING

CROSS-REFERENCE TO RELATED APPLICATION(S)

This application claims priority to Korean Patent Application No. 10-2020-0173172, filed on Dec. 11, 2020, the disclosure of which is incorporated herein by reference in its entirety.

BACKGROUND

Technical Field

The present disclosure relates to a process solution for polymer processing capable of minimizing damage to a metal layer while improving an ability to remove an adhesive polymer.

Description of the Related Art

In the manufacturing process of a semiconductor element, after an electronic circuit, etc. is formed on a surface of a semiconductor wafer (hereinafter also referred to as a 'wafer'), back grinding of the wafer is sometimes performed in order to reduce a thickness of the wafer. In this case, in order to protect a circuit surface of the wafer and to fix the wafer, a support is usually attached to the circuit surface of the wafer with an adhesive polymer such as a silicon polymer interposed therebetween. When the support is attached to the circuit surface of the wafer, it is possible to reinforce the wafer whose thickness has been reduced after back grinding of the wafer, and a back electrode, etc., may be formed on the ground surface of the wafer.

When a process such as the back grinding of the wafer and the formation of the back electrode is completed, the support is removed from the circuit surface of the wafer, the adhesive polymer is peeled off and removed, and the wafer is cut to manufacture a chip.

Meanwhile, recently, a chip stacking technique using a through electrode (e.g., a silicon through electrode) installed through a wafer has been developed. According to this chip stacking technique, since the electronic circuits of a plurality of chips are electrically connected by using through electrodes instead of conventional wires, it is possible to achieve high integration of the chips and speed up the operation. When this chip stacking technique is used, in many cases, the back grinding of the wafer is performed in order to reduce the thickness of an aggregate on which a plurality of chips are stacked, and thus, an opportunity to use a support or an adhesive polymer increases.

However, because the support is generally attached to the circuit surface of the wafer with the adhesive polymer interposed therebetween and thermal curing is then performed for firm attachment of the wafer and the support, when the adhesive polymer is peeled off, the cured adhesive polymer may remain on the support and the circuit surface of the wafer. Therefore, there is a need for a means capable of efficiently removing the cured adhesive polymer remaining on the circuit surface of the wafer while preventing damage to the wafer or a metal film.

Meanwhile, Korean Patent Laid-Open Publication No. 10-2014-0060389 discloses a composition for removing an adhesive polymer, but has problems in that the removal rate for a network polymer is slow or removability of a linear polymer is reduced, and damage to the metal layer occurs.

RELATED ART DOCUMENT

[Patent Document]

(Patent Document 1) Korean Patent Laid-Open Publication No. 10-2014-0060389

SUMMARY

The present disclosure is to improve the problems of the prior art described above, and an object of the present disclosure is to provide a process solution for polymer processing capable of minimizing damage to a metal layer while improving an ability to remove an adhesive polymer remaining on a circuit surface of wafer in a semiconductor manufacturing process.

However, the problem to be solved by the present disclosure is not limited to those mentioned above, and the other unmentioned problems will be clearly understood by those skilled in the art from the following description.

In order to achieve the above object, the present disclosure provides a process solution for polymer processing, containing a polar aprotic solvent, a fluorine-based compound, and a sulfur-containing compound.

Advantageous Effects

The present disclosure provides a process solution for polymer processing capable of preventing damage to a metal layer while improving an ability to remove an adhesive polymer remaining on a circuit surface of a wafer in a semiconductor manufacturing process by containing a polar aprotic solvent, a fluorine-based compound, and a sulfur-containing compound.

DETAILED DESCRIPTION

The present disclosure relates to a process solution for polymer processing, containing a polar aprotic solvent, a fluorine-based compound, and a sulfur-containing compound, and the process solution for polymer processing may prevent damage to a metal layer while improving an ability to remove an adhesive polymer remaining on the circuit surface of a semiconductor wafer or the metal layer.

The adhesive polymer includes a silicone-based resin, and may contain not only a linear non-reactive polydimethylsiloxane-based polymer, but also a polyorganosiloxane resin that forms a network polymer through curing.

In the present disclosure, a process solution for polymer processing contains a polymer cleaning solution, a polymer stripping solution, and a polymer etching solution, and the polymer cleaning solution is most preferable.

Throughout the present specification, the term "alkyl group" refers to a hydrocarbon group linked by a single bond.

Process Solution for Polymer Processing

The process solution for polymer processing according to the present disclosure may contain a polar aprotic solvent, a fluorine-based compound, and a sulfur-containing compound, and may further contain other additives.

In addition, the process solution for polymer processing according to the present disclosure does not contain water that is artificially injected, and does not preferably contain substantially water. However, a hydrate of the fluorine-based compound may be used if necessary, and as a result, a small amount of water may be contained. In this case, the small amount of water may be contained in an amount of less than 4% by weight based on the total weight of the composition. When water is optionally contained, the removability to a polymer such as a silicone resin may be lowered, and damage to a metal film may be increased.

In addition, it is preferable that the process solution for polymer processing according to the present disclosure does not contain a compound including a hydroxide (—OH) group in a molecular structure, such as an alcohol-based compound. When a hydroxide group is included in the molecular structure, there may be a problem in that the activity of the fluorine-based compound is inhibited, such that the removability of the silicone resin is reduced.

(A) Polar Aprotic Solvent

The process solution for polymer processing according to the present disclosure contains one or more polar aprotic solvents, and two or more polar aprotic solvents may be used together, if necessary. The polar aprotic solvent swells a silicone polymer and serves to dissolve the fluorine-based compound and the decomposed silicone polymer.

The polar aprotic solvent according to the present disclosure may contain one or more selected from the group consisting of ketone-based, acetate-based, amide-based, pyridine-based, morpholine-based, pyrrolidone-based, urea-based, phosphate-based, sulfoxide-based, nitrile-based, carbonate-based, oxazolidone-based, piperazine-based, and furan-based solvents.

Meanwhile, in the case of water or alcohol-based compounds (e.g., diethylene glycol nomomethyl ether, ethylene glycol, isopropyl alcohol, etc.), which are generally known solvents, it is difficult to remove the polymer by hydrogen bonding with the fluorine ion. Therefore, it is preferable that a solvent of a process solution for polymer processing according to the present disclosure contains substantially no water and alcohol-based compounds.

The ketone-based solvent may contain a compound represented by the following Formula 7-1:

[Formula 7-1]

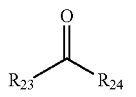

wherein $R_{23}$ and $R_{24}$ are each independently a $C_1$-$C_{18}$ linear or branched aliphatic hydrocarbon group, and the sum of carbon atoms of $R_{23}$ and $R_{24}$ is preferably 2 or more and less than 30.

For example, the ketone-based solvent may include, but is not limited to, 2-heptanone, 3-heptanone, 4-heptanone, 3-pentanone, 2-hexanone, 3-hexanone, 4-methyl-2-pentanone, 5-methyl-2-hexanone, or 2,6-dimethyl-4-hexanone, etc.

For example, the acetate-based solvent may include, but is not limited to, methyl acetate, ethyl acetate (EA), propyl acetate, isopropyl acetate, N-butyl acetate, isobutyl acetate, sec-butyl acetate, amyl acetate, pentyl acetate, isopentyl acetate, octyl acetate, benzyl acetate, phenyl acetate, ethoxyethyl acetate, methoxybutyl acetate (MBA), propylene glycol monomethyl ether acetate (PGMEA), vinyl acetate, or ethyl ethoxypropionate (EEP), etc.

For example, the amide-based solvent may include, but is not limited thereto, N,N-dimethylformamide, N,N-diethylformamide, N,N-dimethylacetamide, N,N-diethylacetamide, N,N-dipropylacetamide, N-ethyl-N-methylacetamide, N,N-dimethylpropionamide, N,N-dimethylbutyramide, N,N-dimethylisobutyramide, N,N-dimethylpentanamide, N,N-diethylpropanamide, or N,N-dibutylpropanamide, etc.

The pyridine-based solvent may contain a compound represented by the following Formula 7-2:

[Formula 7-2]

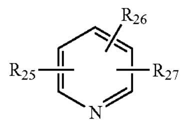

wherein $R_{25}$ to $R_{27}$ may be each independently hydrogen, a $C_1$-$C_{10}$ linear or branched aliphatic hydrocarbon group, a halogen (e.g., F, Cl, Br, or I), an aldehyde group (—CHO), an acetaldehyde group (—$COCH_3$), a $C_1$-$C_4$ alkoxy group, a vinyl group, an acetylene group, a cyano group (—CN), or a methylsulfide group (—$SCH_3$).

For example, the pyridine-based solvent may include, but is not limited to, pyridine, 2-methylpyridine, 3-methylpyridine, 4-methylpyridine, 4-ethylpyridine, 4-propylpyridine, 4-isopropylpyridine, 4-amylpyridine, 2,3-lutidine, 2,4-lutidine, 2,5-lutidine, 3,4-lutidine, 3,5-lutidine, or 2,4,6-trimethylpyridine, etc.

The morpholine-based solvent may contain a compound represented by the following Formula 7-3:

[Formula 7-3]

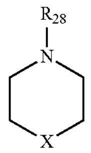

wherein $R_{28}$ is hydrogen; a $C_1$-$C_6$ linear or branched aliphatic hydrocarbon group; a vinyl group; a cyano group (—CN); a $C_1$-$C_4$ aliphatic hydrocarbon group substituted with a tertiary amine; a phenyl group or a pyridine group substituted with a $C_1$-$C_4$ alkyl group, a cyano group (—CN), a halogen group (e.g., F, Cl, Br, or I) or an aldehyde group (—CHO), X is oxygen or —$NR_{29}$—, and $R_{29}$ is a $C_1$-$C_4$ aliphatic hydrocarbon group.

For example, the morpholine-based solvent may include, but is not limited to, N-methylmorpholine, N-ethylmorpholine, N-arylmorpholine, N-butylmorpholine, or N-isobutylmorpholine, etc.

For example, the pyrrolidone-based solvent may include, but is not limited to, N-methylpyrrolidone (NMP), N-ethylpyrrolidone (NEP), or N-vinylpyrrolidone (NVP), etc.

The urea-based solvent may contain a compound represented by the following Formula 7-4:

[Formula 7-4]

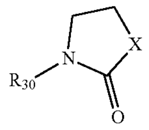

wherein X is oxygen or —$NR_{29}$—, $R_{29}$ and $R_{30}$ are each independently a $C_1$-$C_6$ linear, branched or cyclic aliphatic hydrocarbon group; or a $C_1$-$C_4$ aliphatic hydrocarbon group substituted with a vinyl group, a phenyl group, an acetylene group, a methoxy group, or a dimethylamino group.

For example, the urea-based solvent may include, but is not limited to, tetramethylurea, tetraethylurea, or tetrabutylurea, etc.

The phosphate-based solvent may contain a compound represented by the following Formula 7-5:

[Formula 7-5]

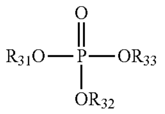

wherein $R_{31}$ to $R_{33}$ are each independently a $C_1$-$C_8$ linear or branched aliphatic hydrocarbon group; a $C_3$-$C_8$ divalent aliphatic hydrocarbon group forming a ring together with adjacent oxygen; a phenyl group unsubstituted or substituted with a $C_1$-$C_4$ aliphatic hydrocarbon group; a $C_2$-$C_4$ aliphatic hydrocarbon group substituted with halogen (e.g., F, Cl, Br, or I), or a phenyl group substituted with halogen.

For example, the phosphate-based solvent may include, but is not limited to, triethyl phosphate, tributyl phosphate, triamyl phosphate, or triallyl phosphate, etc.

For example, the sulfoxide-based solvent may include, but is not limited to, dimethyl sulfoxide (DMSO), dibutyl sulfoxide, diphenyl sulfoxide, dibenzyl sulfoxide, or methylphenyl sulfoxide, etc.

For example, the nitrile-based solvent may include, but is not limited to, propionitrile, butyronitrile, isobutyronitrile, acetonitrile, trimethylacetonitrile, or phenylacetonitrile, etc.

For example, the carbonate-based solvent may include, but is not limited to, dimethyl carbonate (DMC), diethyl carbonate, diphenyl carbonate, dibenzyl carbonate, ethylene carbonate, propylene carbonate (PC), or vinylene carbonate, etc.

For example, the oxazolidone-based solvent may include, but is limited to, 2-oxazolidone, 3-methyl-2-oxazolidone, etc.

For example, the piperazine-based solvent may include, but is not limited to, dimethylpiperazine, dibutylpiperazine, etc.

The furan-based solvent may contain a compound represented by the following Formula 7-6 or 7-7:

[Formula 7-6]

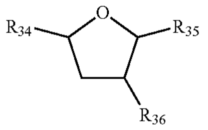

[Formula 7-7]

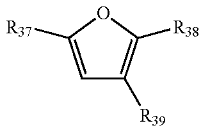

wherein $R_{34}$ to $R_{39}$ may be each independently hydrogen; or a $C_1$-$C_5$ linear or branched aliphatic hydrocarbon group unsubstituted or substituted with an alkoxy group, a cyano group or a halogen, or a $C_1$-$C_5$ alkyl group substituted with an alkoxy group, a cyano group, or a halogen.

For example, the furan-based solvent may include, but is not limited to, tetrahydrofuran, 2-methyltetrahydrofuran, 3-methyltetrahydrofuran, 2,5-dimethyltetrahydrofuran, (tetrahydrofuran-2yl)acetonitrile, tetrahydrofurfuryl chloride, 2,5-dimethoxytetrahydrofuran, furan, 2-methylfuran, 2-ethylfuran, 2-propylfuran, 2-butylfuran, 2-pentylfuran, 3-methylfuran, 2,3-dimethylfuran, 2,5-dimethylfuran, 2-cyanofuran, or 2,5-dicyanofuran, etc.

The polar aprotic solvent is contained in an amount of 66 to 99.89% by weight, preferably 70 to 99.45% by weight, based on the total weight of the process solution for polymer processing. If the polar aprotic solvent is contained in an amount of less than 66% by weight, there may be a problem in that the metal film is damaged. If the polar aprotic solvent is contained in an amount of exceeding 99.89% by weight, there may be a problem in that the silicone-based resin attached to an electronic component may not be effectively removed.

(B) Fluorine-Based Compound

The process solution for polymer processing according to the present disclosure contains one or more fluorine-based compounds, and the fluorine-based compound serves to reduce a molecular weight by breaking a ring of the silicone polymer.

The fluorine-based compound according to the present disclosure may contain one or more compounds selected from the group consisting of alkylammonium fluoride, alkylphosphonium fluoride, and alkylsulfonium fluoride.

The alkylammonium fluoride may contain a compound represented by the following Formula 4-1 or 4-2:

[Formula 4-1]

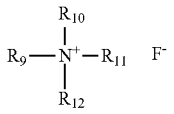

wherein $R_9$ to $R_{12}$ are each independently an alkyl group having 3 to 10 carbon atoms. When $R_9$ to $R_{12}$ are an alkyl group having 2 or less carbon atoms, the solubility of the fluorine-based compound in the solvent is reduced, and thus precipitation occurs immediately after mixing, or precipitation occurs after some time has elapsed.

[Formula 4-2]

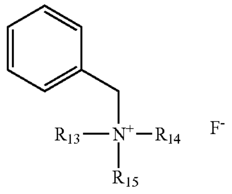

wherein $R_{13}$ to $R_{15}$ are each independently an alkyl group having 1 to 10 carbon atoms.

For example, the alkylammonium fluoride may include, but is not limited to, tetrabutylammonium bifluoride (TBAF.HF), tetrabutylammonium fluoride (TBAF), tetraoctylammonium fluoride (TOAF), or benzyltrimethylammonium fluoride (BTMAF), etc.

In addition, the alkylammonium fluoride may exist in the form of a hydrate, such as alkylammonium fluoride.n($H_2O$), where n is an integer of 5 or less. Examples of the alkylammonium fluoride may include, but is not limited to, tetra-n-butylammonium fluoride hydrate, tetra-n-butylammonium fluoride trihydrate, or benzyltrimethylammonium fluoride hydrate, etc.

In addition, the alkylphosphonium fluoride may contain a compound represented by the following Formula 5:

[Formula 5]

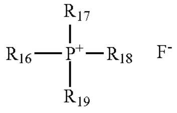

wherein $R_{16}$ to $R_{19}$ are each independently an aliphatic hydrocarbon having 1 to 22 carbon atoms or an aromatic hydrocarbon having 6 to 20 carbon atoms.

For example, the alkyl phosphonium fluoride may include, but is limited to, tetrabutylphosphonium fluoride, triethyloctylphosphonium fluoride, or cetyltrimethylphosphonium fluoride, etc.

In addition, the alkylsulfonium fluoride may contain a compound represented by the following Formula 6:

[Formula 6]

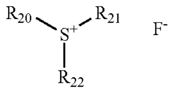

wherein $R_{20}$ to $R_{22}$ are each independently an aliphatic hydrocarbon having 1 to 22 carbon atoms or an aromatic hydrocarbon having 6 to 20 carbon atoms.

For example, the alkylsulfonium fluoride may include, but is not limited to, tributylsulfonium fluoride, trioctylsulfonium fluoride, or n-octyldimethylsulfonium fluoride, etc.

The fluorine-based compound is contained in an amount of 0.1 to 20% by weight, preferably 0.5 to 17% by weight, based on the total weight of the process solution for polymer processing. If the fluorine-based compound is contained in an amount of less than 0.1% by weight, there may be a problem that the silicone-based resin attached to electronic parts, etc., may not be effectively removed. If the fluorine-based compound is contained in an amount of exceeding 20% by weight, the moisture content is increased over time, and damage to the metal film may increase due to a decrease in the removal performance of the silicone resin and an increase in fluoride.

(C) Sulfur-Containing Compound

The process solution for polymer processing according to the present disclosure contains one or more sulfur-containing compounds in order to reduce damage to a metal film exposed to a lower portion of the adhesive, and the sulfur-containing compound preferably includes a thiol group (—SH). In addition, the sulfur-containing compound may provide a metal anticorrosive effect without impairing a polymer removal performance of the process solution for polymer processing.

In the present disclosure, when the sulfur-containing compound deviates from the structures of Formulas 1 to 3 described later, for example, when it contains —OH or —NH—, $NH_2$, a hydrogen bond is formed with the fluorine-based compound, so that the removal performance of the polymer is rapidly reduced, which makes it impossible to meet the purpose of the present disclosure.

The sulfur-containing compound according to the present disclosure may be a component additionally contained in addition to the polar aprotic solvent and the fluorine-based compound contained in the composition of the present disclosure.

The sulfur-containing compound may contain one or more compounds represented by any one of the following Formulas 1-1 to 3:

$R_1$—SH [Formula 1-1]

$R_1$—S—S—$R_1$ [Formula 1-2]

wherein $R_1$ is a linear or branched alkyl group having 3 to 12 carbon atoms unsubstituted or substituted with a thiol group, a cyclic hydrocarbon group having 3 to 12 carbon atoms unsubstituted or substituted with a thiol group or halogen, and the halogen is fluorine, chlorine, bromine, or iodine.

For example, the sulfur-containing compound represented by Formula 1-1 may include, but is not limited to, propane-1-thiol, butane-1-thiol, pentane-1-thiol, hexane-1-thiol, heptane-1-thiol, octane-1-thiol, decane-1-thiol, dodecane-1-thiol, 2-methylpropane-1-thiol, 2-methylpropane-2-thiol, 3-methyl-2-butanethiol, 3-methyl-1-butanethiol, 2-ethyl-1-hexanethiol, 1,3-propanedithiol, cyclopentanethiol, cyclohexanethiol, phenylmethanethiol, 2-phenylethanethiol, 4-(tert-butyl)phenylmethanethiol, or furfurylmercaptan, etc.

For example, the sulfur-containing compound represented by Formula 1-2 may include, but is not limited to, diethyldisulfide, dipropyldisulfide, diisopropyldisulfide, diisoamyldisulfide, diamyldisulfide, dibutyldisulfide, diisobutyldisulfide, di-tert-butyldisulfide, methylpropyldisulfide, diphenyldisulfide, didodecyldisulfide, bis(1,1,3,3-tetramethylbutyl)disulfide, or di-tert-dodecyldisulfide, etc. The sulfur-containing compound represented by Formula 1-2 may be formed by oxidation of a compound containing a thiol group (e.g., the compound represented by Formula 1-1).

[Formula 2]

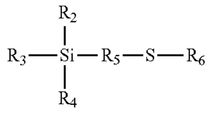

wherein $R_2$ to $R_4$ and $R_6$ are each independently a hydrogen atom, an alkyl group having 1 to 5 carbon atoms, an alkoxy group having 1 to 5 carbon atoms, or an unsaturated hydrocarbon group having 2 to 5 carbon atoms including a double bond, and $R_5$ is a direct linkage or an alkylene group having 1 to 5 carbon atoms.

For example, the sulfur-containing compound represented by Formula 2 may include, but is not limited to, (3-mercaptopropyl)trimethoxysilane, 2-(trimethylsilyl)ethanethiol, trimethyl(2-methylsulfanylethyl)silane, (3-mercaptopropyl)methyldimethoxysilane, or (ethylthio)trimethylsilane, etc.

[Formula 3]

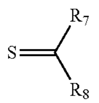

wherein $R_7$ and $R_8$ may be connected to each other to form an alicyclic or aromatic monocyclic or polycyclic ring, and the monocyclic or polycyclic ring may include one or more hetero atoms selected from nitrogen (N), oxygen (O), or sulfur (S), and may be substituted with one or more substituents.

In addition, the sulfur-containing compound represented by Formula 3 may have a resonance structure with a sulfur atom by connecting $R_7$ and $R_8$ to each other to form a ring, and may include a thiol group due to the resonance structure.

For example, the sulfur-containing compound represented by Formula 3 may include, but is not limited to, 2-mercaptothiazoline, 2-amino-5-mercapto-1,3,4-thiadiazole, 2-mercaptobenzoxazole, or 2-mercaptobenzothiazole, etc.

The sulfur-containing compound is contained in an amount of 0.01 to 10% by weight, preferably 0.05 to 7% by weight, based on the total weight of the process solution for polymer processing. If the sulfur-containing compound is included in an amount of less than 0.01% by weight, there may be a problem that the damage to the metal film exposed to the lower portion of the adhesive may not be sufficiently suppressed. If the sulfur-containing compound is included in an amount exceeding 10% by weight, there may be a problem that the removability of the adhesive is reduced.

(D) Other Additives

In the range that does not impair the polymer removal performance of the process solution for polymer processing according to the present disclosure, the process solution for polymer processing may further include components such as corrosion inhibitors and surfactants commonly used in this field in addition to the above components.

The corrosion inhibitor is used to effectively inhibit corrosion of the metal-containing lower layer when the resin is removed, is generally commercially available from various sources, and may be used without further purification.

The surfactant may be used to enhance cleaning properties. For example, an anionic surfactant, a cationic surfactant, and a nonionic surfactant may be used, but among them, it is particularly preferable to use a nonionic surfactant having excellent wettability and less foaming, and these may be used alone or in combination of two or more.

In addition, the present disclosure provides a method for removing a polymer from a device using the process solution for polymer processing according to the present disclosure. A method of removing the polymer according to the present disclosure may be applied to all of the contents described for a process solution for polymer processing according to the present disclosure and detailed descriptions of overlapping parts are omitted, but the same may be applied even if the description is omitted.

Specifically, the method of removing the polymer is to remove a polymer such as a silicon adhesive used in the process of making a device wafer thin, and a process of making the device wafer thin includes a process of forming a silicon adhesive and a silicon release layer between a carrier wafer and a device wafer to make a semiconductor substrate thin. The silicon release layer does not cause damage to the device wafer at a location where separation occurs in the process of removing the carrier wafer after processing. The silicone adhesive bonds the device wafer and the carrier wafer and undergoes a curing process. After such a process, the cured polymer is removed using the process solution for polymer processing according to the present disclosure.

Hereinafter, the present disclosure will be described in more detail through the examples. However, the following examples are for describing the present disclosure in more detail, and the scope of the present disclosure is not limited by the following examples.

Examples 1 to 26 and Comparative Examples 1 to 5: Preparation of Process Solutions for Polymer Processing A process solution for polymer processing was prepared according to the components and composition ratios shown in Tables 1 and 2 below.

TABLE 1

| | Fluorine-based compound | Content (wt %) | Polar aprotic solvent | Content (wt %) | Sulfur-containing compound | Content (wt %) |
|---|---|---|---|---|---|---|
| Example 1 | A | 5 | 2-heptanone | 94.5 | 2-mercaptobenzothiazole | 0.5 |
| Example 2 | B | 6 | N,N-dimethylpropanamide | 93.5 | 2-amino-5-mercapto-1,3,4-thiadiazole | 0.5 |
| Example 3 | C | 7 | N-ethylpyrrolidone | 88 | Dodecane-1-thiol | 5 |
| Example 4 | D | 8 | N-ethylpyrrolidone | 91 | Dodecane-1-thiol | 1 |
| Example 5 | E | 8 | N-ethylpyrrolidone | 91 | Dodecane-1-thiol | 1 |
| Example 6 | B | 5 | N-ethylpyrrolidone | 93 | Dodecane-1-thiol | 2 |
| Example 7 | B | 7 | N-methylmorpholine | 92 | (3-mercaptopropyl)trimethoxysilane | 1 |
| Example 8 | B | 7 | N-butyl acetate/PGMEA | 40/52.5 | (3-mercaptopropyl)trimethoxysilane | 0.5 |
| Example 9 | A | 5 | 4-methylpyridine | 93 | (3-mercaptopropyl)trimethoxysilane | 2 |
| Example 10 | A | 4 | Dimethylpiperazine | 95 | (3-mercaptopropyl)trimethoxysilane | 1 |
| Example 11 | B | 5 | Butyronitrile | 94.5 | Dodecane-1-thiol | 0.5 |
| Example 12 | B | 5 | Dimethyl carbonate/ N,N-dimethylpropanamide | 30/64.5 | Dodecane-1-thiol | 0.5 |
| Example 13 | B | 7 | 2-oxazolidone/ N,N-diethylacetamide | 20/72 | Dodecane-1-thiol | 1 |
| Example 14 | B | 1 | N,N-diethylacetamide | 98.5 | Octane-1-thiol | 0.5 |
| Example 15 | C | 15 | N,N-diethylacetamide | 83 | Octane-1-thiol | 2 |
| Example 16 | B | 0.5 | N,N-diethylacetamide | 99.49 | Octane-1-thiol | 0.01 |
| Example 17 | B | 17 | N,N-diethylacetamide | 71 | Octane-1-thiol | 12 |
| Example 18 | B | 6 | N,N-dimethylpropanamide | 92 | Dodecane-1-thiol | 2 |
| Example 19 | B | 6 | N,N-dimethylpropanamide | 93.8 | 2-amino-5-mercapto-1,3,4-thiadiazole | 0.2 |
| Example 20 | A | 5 | 2-methyltetrahydrofuran/ N,N-dimethylpropanamide | 30/64 | Dodecane-1-thiol | 1 |

TABLE 1-continued

| | Fluorine-based compound | Content (wt %) | Polar aprotic solvent | Content (wt %) | Sulfur-containing compound | Content (wt %) |
|---|---|---|---|---|---|---|
| Example 21 | B | 8 | Triethylphosphate | 90.5 | (3-mercaptopropyl)methyldimethoxysilane | 1.5 |
| Example 22 | B | 8 | Tetraethylurea | 90.5 | (3-mercaptopropyl)methyldimethoxysilane | 1.5 |
| Example 23 | B | 5 | N,N-diethylacetamide | 93 | Di-tert-dodecyldisulfide | 2 |
| Example 24 | B | 7 | 3-pentanone | 91 | Thioglycerol | 2 |
| Example 25 | B | 7 | 3-pentanone | 92 | Benzothiazole | 1 |
| Example 26 | B | 7 | 3-pentanone | 92 | Thiazoline | 1 |

TABLE 2

| | Fluorine-based compound | Content (wt %) | Solvent | Content (wt %) | Additive | Content (wt %) |
|---|---|---|---|---|---|---|
| Comp. Example 1 | B | 10 | 2-heptanone | 90 | — | — |
| Comp. Example 2 | B | 10 | Water | 90 | — | — |
| Comp. Example 3 | B | 6 | N,N-diethylacetamide | 93 | Octane | 1 |
| Comp. Example 4 | B | 6 | N,N-diethylacetamide | 93.5 | Benzotriazole | 0.5 |
| Comp. Example 5 | C | 12 | Tetraethylurea | 86 | Methyltrimethoxysilane | 2 |

The fluorine-based compounds used in Tables 1 and 2 are as follows.

A) TBAF.HF: Tetrabutylammonium bifluoride

B) TBAF: Tetrabutylammonium fluoride trihydrate

C) BTMAF: Benzyltrimethylammonium fluoride hydrate

D) Tetrabutylphosphonium fluoride

E) Tributylsulfonium fluoride

Experimental Example 1: Evaluation of Removability of Thin Film Substrate—Network Polymer A wafer on which a cured silicone polymer was coated at a thickness of 50 μm and which was cut into a size of 2×2 $cm^2$ was used, and the prepared sample was immersed in a composition solution at 25° C. for 1 minute while rotating the composition solution at 400 rpm, washed with isopropyl alcohol (IPA), and then dried. After evaluation, a thickness of the film of the cured silicone polymer was measured by SEM. Then, by measuring a film thickness of the remaining silicone-based resin was measured by a scanning electron microscope (SEM), the removal rate was calculated and summarized in Tables 3 and 4 below.

Removal rate (μm/min)=[Thickness before evaluation (μm)−Thickness after evaluation (μm)]/Evaluation time (min)

Experimental Example 2: Evaluation of Removability of Thin Film Substrate—Linear PDMS A silicon wafer on which a blend obtained by mixing a polydimethylsiloxane prepolymer and a curing agent in a predetermined mass ratio was spin-coated and which was cut into a size of 2×2 $cm^2$ was used, and the prepared sample was immersed in a composition solution at 25° C. for 1 minute while rotating the composition solution at 400 rpm, washed with IPA and then dried. After evaluation, the residues on the wafer surface were observed by an optical microscope and SEM. The presence/absence of residues is shown in Tables 3 and 4 below according to the following criteria.

Evaluation Criteria

O: Absence of residue

X: Presence of residue

Experimental Example 3: Metal Damage Evaluation 1

A wafer on which 1011 bump balls composed of Sn, Sn/Ag alloy, Sn/Au alloy, Sn/Ag/Cu alloy, etc., were formed and which was cut into a size of 2×2 $cm^2$ was used, and the prepared sample was immersed for 30 minutes while rotating a composition solution at 25° C. at 400 rpm, washed with IPA and then dried. After evaluation, the number of bump ball damage was confirmed by SEM, and the number of occurrences was summarized in Tables 3 and 4 below.

Experimental Example 4: Metal Damage Evaluation 2

In addition, a wafer on which an aluminum thin film was formed and which was cut into a size of 2×2 $cm^2$ was used, and the prepared sample was immersed for 30 minutes while rotating the composition solution at 25° C. at 400 rpm, washed with IPA and then dried. In addition, after evaluation, pad defects were confirmed by an optical microscope, and the results according to the following evaluation criteria are summarized in Tables 3 and 4 below.

Evaluation Criteria

O: No change in surface morphology and no discoloration

Δ: Discoloration

TABLE 3

| | Network polymer removal rate (μm/min) | Linear PDMS residue evaluation | Bump ball damage number (ea/1011ea) | Al damage |
|---|---|---|---|---|
| Example 1 | 21 | ○ | 5 | ○ |
| Example 2 | 25 | ○ | 3 | ○ |
| Example 3 | 22 | ○ | 0 | ○ |
| Example 4 | 21 | ○ | 0 | ○ |
| Example 5 | 22 | ○ | 0 | ○ |
| Example 6 | 21 | ○ | 0 | ○ |
| Example 7 | 26 | ○ | 1 | ○ |
| Example 8 | 22 | ○ | 4 | ○ |
| Example 9 | 23 | ○ | 0 | ○ |
| Example 10 | 25 | ○ | 0 | ○ |
| Example 11 | 21 | ○ | 0 | ○ |
| Example 12 | 23 | ○ | 0 | ○ |
| Example 13 | 29 | ○ | 0 | ○ |
| Example 14 | 21 | ○ | 0 | ○ |
| Example 15 | 35 | ○ | 0 | ○ |
| Example 16 | 22 | ○ | 0 | ○ |
| Example 17 | 26 | ○ | 0 | ○ |
| Example 18 | 22 | ○ | 0 | ○ |
| Example 19 | 28 | ○ | 2 | ○ |
| Example 20 | 32 | ○ | 0 | ○ |
| Example 21 | 22 | ○ | 4 | ○ |
| Example 22 | 26 | ○ | 2 | ○ |
| Example 23 | 30 | ○ | 0 | ○ |
| Example 24 | 18 | ○ | 10 | Δ |
| Example 25 | 24 | ○ | 10 | Δ |
| Example 26 | 22 | ○ | 13 | Δ |

TABLE 4

| | Network polymer removal rate (μm/min) | Linear PDMS residue evaluation | Bump ball damage number (ea/1011ea) | Al damage |
|---|---|---|---|---|
| Comp. Example 1 | 25 | ○ | 42 | Δ |
| Comp. Example 2 | 0 | X | 1011 | X |
| Comp. Example 3 | 23 | ○ | 44 | Δ |
| Comp. Example 4 | 22 | ○ | 33 | Δ |
| Comp. Example 5 | 25 | ○ | 73 | Δ |

Referring to Tables 3 and 4, it can be seen that the process solutions for polymer processing of Examples 1 to 26 according to the present application contains a sulfur-containing compound, and thus the removability to silicon-based network polymers and linear polymers was excellent, and the damage to the metal was significantly reduced. In particular, it can be seen that among the sulfur-containing compounds, in the case of Examples 1 to 23 using a sulfur-containing compound satisfying the structures of Formulas 1-1 to 3, the polymer removal ability was excellent, the bump ball damage was 5 or less or did not occur at all, and the Al damage did not occur, so the metal damage prevention effect was more excellent.

Meanwhile, it was seen that in Comparative Example 2 in which only a fluorine-based compound was used without a polar aprotic solvent, polymer removal was impossible, even if the fluorine-based compound and the polar aprotic solvent were contained, when the sulfur-containing compound was not used or other additives were used, the number of bump ball damage was significantly increased, and there was also damage to the aluminum.

What is claimed is:

1. A process solution for polymer processing, comprising a polar aprotic solvent, a fluorine-based compound, and a sulfur-containing compound, and water, wherein the process solution has a water content of less than 4% by weight based on a total weight of the process solution, wherein the polar aprotic solvent comprises one or more selected from the group consisting of ketone-based, acetate-based, amide-based, pyridine-based, morpholine-based, pyrrolidone-based, urea-based, phosphate-based, nitrile-based, carbonate-based, oxazolidone-based, piperazine-based, and furan-based solvents, wherein the fluorine-based compound comprises one or more compounds selected from the group consisting of alkylammonium fluoride, alkylphosphonium fluoride, and alkylsulfonium fluoride, wherein the sulfur-containing compound comprises one or more compounds represented by any one of the following Formulas 1-1 to 3:

$R_1$—SH [Formula 1-1]

$R_1$—S—S—$R_1$ [Formula 1-2]

wherein $R_1$ is a linear or branched alkyl group having 3 to 12 carbon atoms unsubstituted or substituted with a thiol group, a cyclic hydrocarbon group having 3 to 12 carbon atoms unsubstituted or substituted with a thiol group or halogen, and the halogen is fluorine, chlorine, bromine, or iodine,

[Formula 2]

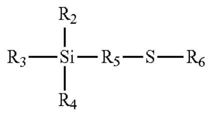

wherein $R_2$ to $R_4$ and $R_6$ are each independently a hydrogen atom, an alkyl group having 1 to 5 carbon atoms, an alkoxy group having 1 to 5 carbon atoms, or an unsaturated hydrocarbon group having 2 to 5 carbon atoms including a double bond, and $R_5$ is a direct linkage or an alkylene group having 1 to 5 carbon atoms, wherein the compound represented by Formula 2 is one or more selected from the group consisting of 2-(trimethylsilyl)ethanethiol, trimethyl(2-methylsulfanylethyl)silane, (3-mercaptopropyl)methyldimethoxysilane, and (ethylthio)trimethylsilane, and

[Formula 3]

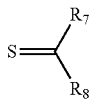

where $R_7$ and $R_8$ are connected to each other to form an unsubstituted or substituted alicyclic or aromatic monocyclic or polycyclic ring, wherein the monocyclic or polycyclic ring comprises one or more hetero atoms selected from nitrogen (N), oxygen (O), or sulfur (S), and wherein the compound represented by Formula 3 is one or more selected from the group consisting of 2-amino-5-mercapto-1,3,4-thiadiazole and 2-mercaptobenzoxazole.

2. The process solution for polymer processing of claim 1, wherein the compound represented by Formula 1-1 is one or more selected from the group consisting of propane-1-thiol, butane-1-thiol, pentane-1-thiol, hexane-1-thiol, heptane-1-thiol, octane-1-thiol, decane-1-thiol, dodecane-1-thiol, 2-methylpropane-1- thiol, 2-methylpropane-2-thiol, 3-methyl-2-butanethiol, 3-methyl-1-butanethiol, 2-ethyl-1-hexanethiol, 1,3-propanedithiol, cyclopentanethiol, cyclohexanethiol, phenylmethanethiol, 2-phenylethanethiol, 4-(tert-butyl)phenylmethanethiol, and furfurylmercaptan.

3. The process solution for polymer processing of claim 1, wherein the compound represented by Formula 1-2 is one or more selected from the group consisting of diethyldisulfide, dipropyldisulfide, diisopropyldisulfide, diisoamyldisulfide, diamyldisulfide, dibutyldisulfide, diisobutyldisulfide, di-tert-butyldisulfide, methylpropyldisulfide, diphenyldisulfide, didodecyldisulfide, bis(1,1,3,3-tetramethylbutyl)disulfide, and di-tert-dodecyldisulfide.

4. The process solution for polymer processing of claim 1, wherein the alkylammonium fluoride comprises a compound represented by the following Formula 4-1 or 4-2:

[Formula 4-1]

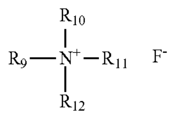

wherein $R_9$ to $R_{12}$ are each independently an alkyl group having 3 to 10 carbon atoms,

[Formula 4-2]

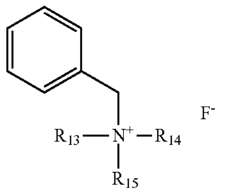

wherein $R_{13}$ to $R_{15}$ are each independently an alkyl group having 1 to 10 carbon atoms.

5. The process solution for polymer processing of claim 1, wherein the alkylphosphonium fluoride comprises a compound represented by the following Formula 5:

[Formula 5]

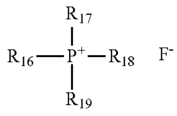

wherein $R_{16}$ to $R_{19}$ are each independently an aliphatic hydrocarbon having 1 to 22 carbon atoms or an aromatic hydrocarbon having 6 to 20 carbon atoms.

6. The process solution for polymer processing of claim 1, wherein the alkylsulfonium fluoride comprises a compound represented by the following Formula 6:

[Formula 6]

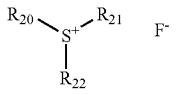

wherein $R_{20}$ to $R_{22}$ are each independently an aliphatic hydrocarbon having 1 to 22 carbon atoms or an aromatic hydrocarbon having 6 to 20 carbon atoms.

7. The process solution for polymer processing of claim 1, wherein the process solution for polymer processing comprises:

66 to 99.89% by weight of the polar aprotic solvent;

0.1 to 20% by weight of the fluorine-based compound; and 0.01 to 10% by weight of the sulfur-containing compound, based on the total weight of the composition.

8. The process solution for polymer processing of claim 1, wherein the process solution for polymer processing is configured to remove a silicone-based polymer.

* * * * *